(12) United States Patent
Wang et al.

(10) Patent No.: US 6,975,184 B2
(45) Date of Patent: Dec. 13, 2005

(54) ADJUSTING THE FREQUENCY OF FILM BULK ACOUSTIC RESONATORS

(75) Inventors: Li-Peng Wang, San Jose, CA (US); Michael Dibattista, Santa Clara, CA (US); Seth Fortuna, Harrisburg, PA (US); Qing Ma, San Jose, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/448,915

(22) Filed: May 30, 2003

(65) Prior Publication Data

US 2004/0239450 A1     Dec. 2, 2004

(51) Int. Cl.[7] ................................................. H03H 9/00
(52) U.S. Cl. ........................ 333/188; 333/120; 438/5; 438/3
(58) Field of Search ................................. 333/188, 120, 333/118, 187, 186, 197; 438/5, 3, 14; 385/48, 385/14

(56) References Cited

U.S. PATENT DOCUMENTS

| | | | | |
|---|---|---|---|---|
| 5,283,458 A | * | 2/1994 | Stokes et al. | 257/416 |
| 5,369,719 A | * | 11/1994 | Mishima et al. | 385/48 |
| 6,570,468 B2 | * | 5/2003 | Ma et al. | 333/188 |
| 6,617,751 B2 | * | 9/2003 | Sunwoo et al. | 310/312 |
| 6,650,455 B2 | * | 11/2003 | Miles | 359/237 |
| 6,698,287 B2 | * | 3/2004 | Kubena et al. | 73/504.12 |
| 6,804,807 B2 | * | 10/2004 | Jamneala et al. | 716/4 |
| 6,816,035 B2 | * | 11/2004 | Ma et al. | 333/187 |
| 2004/0014249 A1 | * | 1/2004 | Jorgenson et al. | |

OTHER PUBLICATIONS

Wang et al., U.S. Appl. No. 10/201,796, filed Jul. 24, 2002, entitled "Adjusting the Frequency of Film Bulk Acoustic Resonators".

* cited by examiner

*Primary Examiner*—Lam T. Mai
(74) *Attorney, Agent, or Firm*—Trop, Pruner & Hu, P.C.

(57) ABSTRACT

A material may be removed from the top electrode of a film bulk acoustic resonator to alter the mass loading effect and to adjust the frequency of one film bulk acoustic resonator on a wafer relative to other resonators on the same wafer. Similarly, the piezoelectric layer or the bottom electrode may be selectively milled with a focused ion beam to trim the resonator.

26 Claims, 2 Drawing Sheets

ADJUSTING THE FREQUENCY OF FILM BULK ACOUSTIC RESONATORS

BACKGROUND

This invention relates generally to front-end radio frequency filters including film bulk acoustic resonators (FBAR).

Film bulk acoustic resonators have many advantages compared to other techniques such as surface acoustic wave (SAW) devices and ceramic filters, particularly at high frequencies. For example, SAW filters begin to have excessive insertion losses above 2.4 gigahertz and ceramic filters are much larger in size and become increasingly difficult to fabricate at increased frequencies.

A conventional FBAR filter may include two sets of FBARs to achieve the desired filter response. The series FBARs have one frequency and the shunt FBARs have another frequency. The frequency of an FBAR is mainly determined by the thickness of its piezoelectric film which approximately equals the half wavelength of the acoustic wave. The frequencies of the FBARs need to be precisely set to achieve the desired filter response.

For example, for a 2 gigahertz FBAR, the thickness of the piezoelectric film may be approximately 1.8 micrometers. A one percent non-uniformity in piezoelectric film thickness may shift the frequency of the filter by approximately 20 megahertz which is not acceptable if a 60 megahertz pass bandwidth is required.

Generally, post-process trimming may be used to correct the frequency. One technique may involve etching the upper electrode or depositing more metal. Another technique involves adding a heating element. However, both of these approaches are problematic in high volume manufacturing, particularly since they are die-level processes that generally have low throughput. In addition, in-situ measurement may be required during the post-process trimming steps. Therefore, the costs are high and the throughput is relatively low.

Thus, there is a need for better ways to adjust the frequency of FBARs.

DETAILED DESCRIPTION

Figure 1:
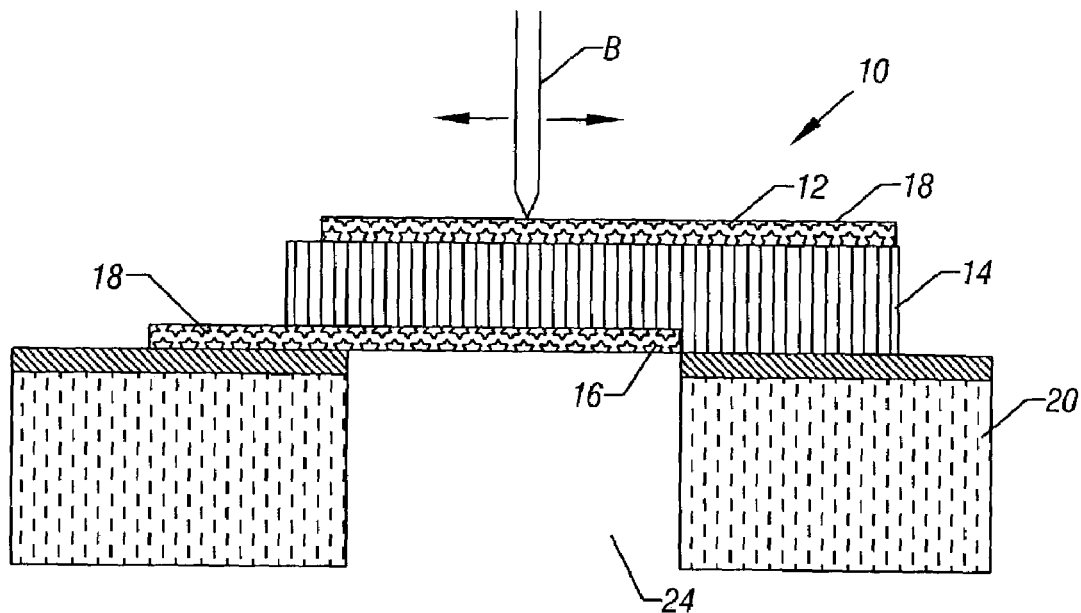
FIG. 1 is an enlarged cross-sectional view of one embodiment of the present invention.
Figure 2:
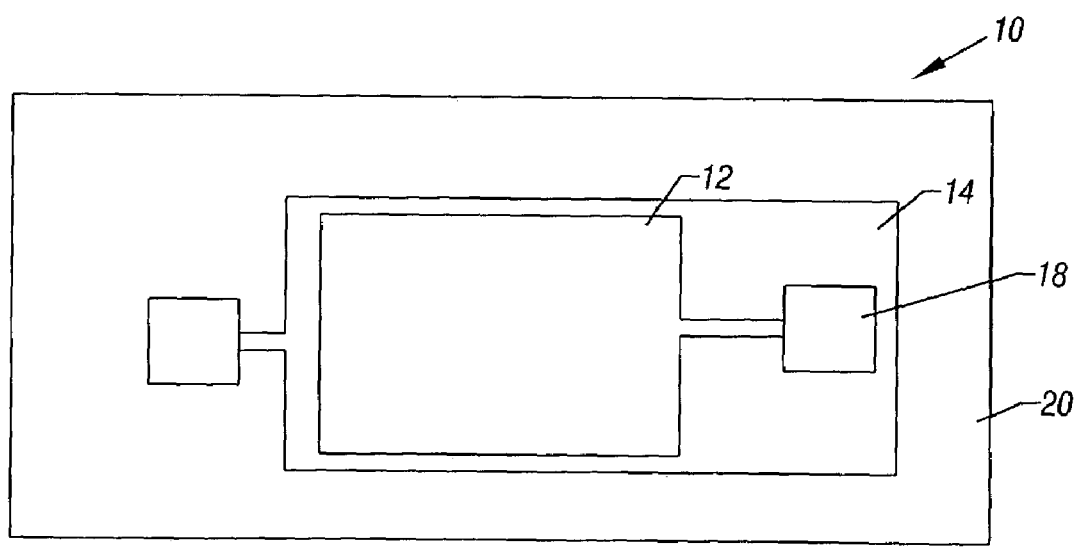
FIG. 2 is a top plan view of the embodiment shown in FIG. 1.

Referring to FIG. 1, a film bulk acoustic resonator (FBAR) 10 may include a top electrode 12 and a bottom electrode 16 sandwiching a piezoelectric layer 14. The entire structure may be supported over a backside cavity 24 in a semiconductor substrate 20. A dielectric film 18 may be interposed between the semiconductor substrate 20 and the remainder of the FBAR 10. As shown in FIGS. 1 and 2, the top electrode 12 may be coupled to a contact 18 and the bottom electrode 16 may be coupled to a different contact 18.

The frequency compensation may be done by altering the mass loading at the wafer level, achieving relatively high throughput without the need for in-situ measurement in some embodiments. Thus, each FBAR 10 on a wafer may have its frequency adjusted to achieve the originally designed frequency for each particular FBAR 10. As necessary, across a wafer, each FBAR 10 may be individually compensated.

After FBAR 10 has been initially fabricated, frequency variations across the wafer may be adjusted. A focused ion beam "B" may be scanned across the wafer to trim the top electrode 12, the bottom electrode 16, or piezoelectric layer 14 or any combination of the above to the desired frequency by adjusting the thickness of a particular layer. The amount of trimming may be determined by the thickness profiles of layers across the wafer or by frequency measurements. Since the processes may be implemented at the wafer level, throughput may be relatively high. In some cases, the focused ion beam trimming may result in a small amount of ions, such as Ga+ ions being implanted.

In one embodiment, the FBARs 10 may be intentionally fabricated so that the highest frequency FBAR 10 is set equal to, but not exceeding, a target value. Then all of the FBARs 10 can be trimmed to meet the target frequency using focused ion beam trimming.

In embodiments in which the top electrode 12 is trimmed, variations of all three layers may be corrected in the most final step. Therefore, this approach may be cost effective and accurate in some embodiments. However, the thickness ratio of metal in the electrodes 12 and 16 to the piezoelectric layer 14 is slightly different after trimming. Thus, the tuning range may be limited in some embodiments.

In accordance with another embodiment of the present invention, trimming may be applied to the bottom electrode 16 at the final step, after turning the wafer over. This approach may be utilized in conjunction with trimming of the top electrode 12, in some cases, to extend the tuning range.

In still another embodiment, the piezoelectric layer 14 may be trimmed. The thickness variation of the piezoelectric layer 14 is the main origin of frequency variation. So the metal to piezoelectric ratio may be relatively constant after trimming. However, pre-bias of the top electrode 12 variation may also need to be taken into account during the trimming process.

In still another embodiment, combinations of each of the above techniques may be utilized to achieve higher tuning range. However, trimming combinations of layers may raise throughput or cost issues.

The thickness profile of the piezoelectric layer 14 may be precisely measured after deposition. The amount of material that needs to be trimmed can be determined according to a thickness profile and electrode 12, 16 variation. The focused ion beam conditions may be programmed according to the thickness profiles of the layers of the various FBARs 10. The focused ion beam mills the layer or layers to tune the frequency of that FBAR 10. As the focused ion beam advances to the next FBAR 10 across the wafer, it then anneals the appropriate amount of material from the next FBAR 10 to achieve uniform frequency. In one embodiment in situ radio frequency measurement may be used during trimming for better control.

Figure 3:
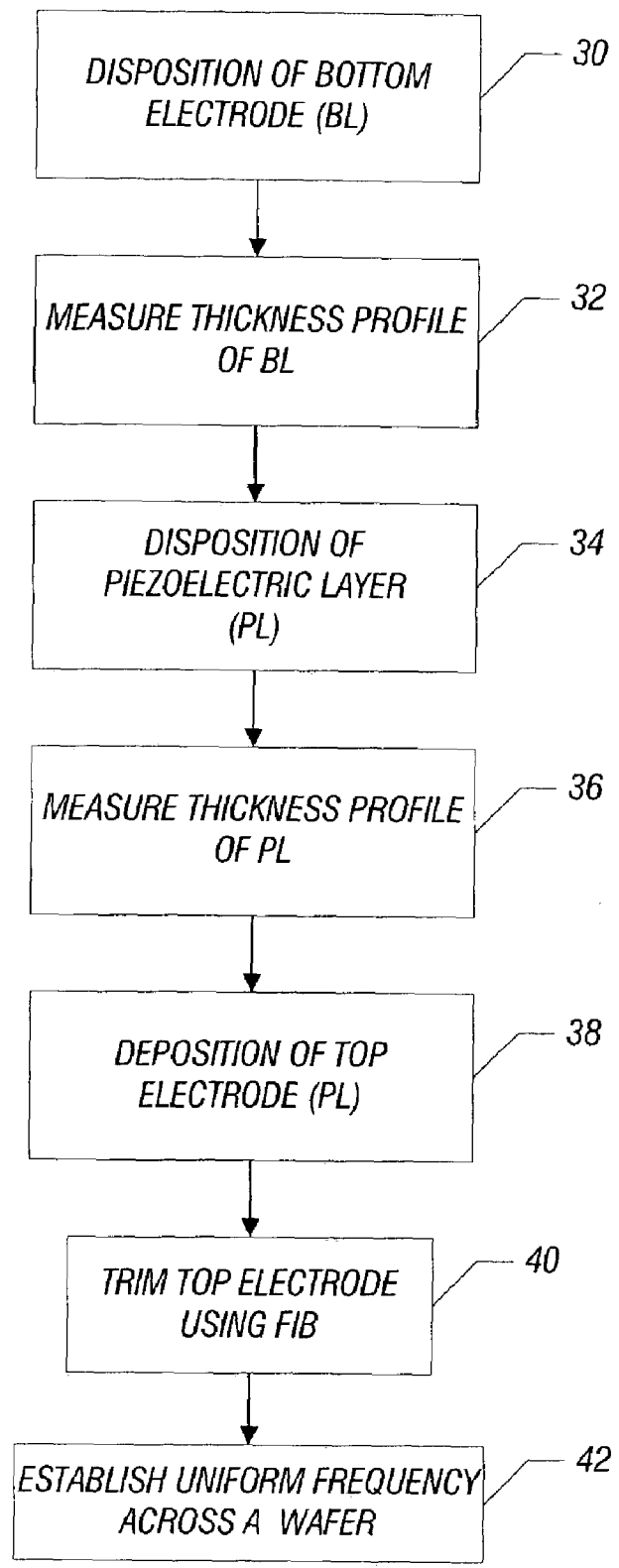
FIG. 3 is a flow chart for one embodiment of the present invention.

Referring to FIG. 3, in accordance with one embodiment, the FBAR 10 may be formed by depositing a bottom electrode 16 as indicated in block 30. A thickness profile of the bottom electrode may be measured as indicated in block 32. Then the piezoelectric layer 14 may be deposited as indicated in block 34. The thickness profile of the piezoelectric layer 14 may be measured as indicated in block 36. Finally, a top electrode 12 may be deposited as indicated in block 38.

The top electrode 12 may be trimmed using a focused ion beam in one embodiment of the present invention. In situ radio frequency testing may be used during the trimming process. The focused ion beam conditions may be programmed according to the previously measured thickness profiles. The focused ion beam may then be scanned across the wafer with a varying, programmable power to vary the amount of material that is removed, as indicated in block 40. As a result, the focused ion beam may be scanned to achieve a relatively uniform frequency across the wafer as indicated in block 42.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming at least two film bulk acoustic resonators on a wafer;
    selectively removing material from said resonators using a focused ion beam to adjust the frequency of the resonators; and
    applying a different level of beam power to each of said resonators.

2. The method of claim 1 including selectively removing material from a top electrode of one of said resonators to adjust the frequency of said resonator.

3. The method of claim 1 including selectively removing material from a piezoelectric layer of one of said resonators to adjust the frequency of said resonator.

4. The method of claim 1 including selectively removing material from a bottom electrode of one of said resonators to adjust the frequency of said resonators.

5. The method of claim 1 including selectively removing material from at least two of a top electrode, bottom electrode, and piezoelectric layer to adjust the frequency of one of said resonators.

6. The method of claim 1 including selectively removing material from a top and a bottom electrode of a resonator to adjust the frequency of said resonator.

7. The method of claim 1 including testing a resonator while selectively removing the material from said resonator using a focused ion beam.

8. The method of claim 1 including measuring the thickness of at least one of a bottom electrode a top electrode, or a piezoelectric layer when forming a film bulk acoustic resonator.

9. The method of claim 8 including using the measured thickness to control the use of the focused ion beam to adjust the frequency of a resonator.

10. A method comprising:
    forming, on the same wafer, at least two film bulk acoustic resonators having a top and bottom electrode and a piezoelectric layer between said electrodes;
    selectively removing material from at least one of said top electrode, bottom electrode, or piezoelectric layer using a focused ion beam to adjust the frequency of said resonator; and
    applying a different level of beam power to each of said resonators.

11. The method of claim 10 including selectively removing material from the top electrode of one of said resonators to adjust the frequency of said resonator.

12. The method of claim 10 including selectively removing material from the piezoelectric layer of one of said resonators to adjust the frequency of said resonator.

13. The method of claim 10 including selectively removing material from the bottom electrode of one of said resonators to adjust the frequency of said resonator.

14. The method of claim 10 including selectively removing material from at least two of said top electrode, said bottom electrode, and said piezoelectric layer to adjust the frequency of one of said resonators.

15. The method of claim 10 including selectively removing material from the top and the bottom electrode of a resonator to adjust the frequency of said resonator.

16. The method of claim 10 including testing the resonator while selectively removing the material from one of said resonator using a focused ion beam.

17. The method of claim 10 including measuring the thickness of at least one of said bottom electrode, said top electrode, or said piezoelectric layer when forming a film bulk acoustic resonator.

18. The method of claim 17 including using the measured thickness to control the use of the focused ion beam to adjust the frequency of the resonator.

19. A method comprising:
    forming at least two film bulk acoustic resonators having a top and bottom electrode layer and a piezoelectric layer between said electrode layers;
    after forming said film bulk acoustic resonators including top and bottom electrode layers and a piezoelectric layer between said electrode layers, then selectively removing material from at least two of said layers to adjust the frequency of said resonators; and
    applying a different level of beam power to each of said resonators.

20. The method of claim 19 including selectively removing material from the top electrode layer of said resonators to adjust the frequency of said resonators.

21. The method of claim 19 including selectively removing material from the piezoelectric layer of said resonators to adjust the frequency of said resonators.

22. The method of claim 19 including selectively removing material from the bottom electrode layer of said resonators to adjust the frequency of said resonators.

23. The method of claim 19 including selectively removing material from the top and the bottom electrode layers of a resonator to adjust the frequency of said resonator.

24. The method of claim 19 including testing the resonators while selectively removing the material from said resonators using a focused ion beam.

25. The method of claim 19 including measuring the thickness of at least one layer when forming a film bulk acoustic resonator.

26. The method of claim 25 including using the measured thickness to control the use of the focused ion beam to adjust the frequency of the resonator.

* * * * *